United States Patent
Ohmi et al.

(10) Patent No.: US 8,895,410 B2
(45) Date of Patent: Nov. 25, 2014

(54) METHOD OF MANUFACTURING SEMICONDUCTOR DEVICE AND SEMICONDUCTOR MANUFACTURING APPARATUS

(75) Inventors: Tadahiro Ohmi, Miyagi (JP); Akinobu Teramoto, Miyagi (JP); Hiroshi Akahori, Miyagi (JP)

(73) Assignee: Tadahiro Ohmi, Sendai-shi, Miyagi (JP)

( * ) Notice: Subject to any disclaimer, the term of this patent is extended or adjusted under 35 U.S.C. 154(b) by 1733 days.

(21) Appl. No.: 11/991,908

(22) PCT Filed: Sep. 13, 2005

(86) PCT No.: PCT/JP2005/016805
§ 371 (c)(1),
(2), (4) Date: May 9, 2008

(87) PCT Pub. No.: WO2007/032057
PCT Pub. Date: Mar. 22, 2007

(65) Prior Publication Data
US 2010/0173477 A1    Jul. 8, 2010

(51) Int. Cl.
H01L 21/322 (2006.01)
H01L 21/223 (2006.01)
H01L 21/30 (2006.01)
H01L 29/78 (2006.01)
H01L 29/66 (2006.01)
H01L 21/31 (2006.01)

(52) U.S. Cl.
CPC .... *H01L 21/3003* (2013.01); *B65G 2201/0247* (2013.01); *H01L 29/7833* (2013.01); *H01L 29/6659* (2013.01); *H01L 21/31* (2013.01)
USPC ............................ 438/477; 257/E21.212

(58) Field of Classification Search
CPC ............... H01L 21/02041; H01L 21/02057; H01L 21/22; H01L 21/223; H01L 21/2236; H01L 21/3221; H01L 21/67017; H01L 21/67028; H01L 21/67034; H01L 21/67057; H01L 21/02054
USPC .................................. 438/477; 257/E21.212
See application file for complete search history.

(56) References Cited

U.S. PATENT DOCUMENTS 5,578,504 A * 11/1996 Mitani et al. .................... 438/17
5,621,605 A * 4/1997 Inaba et al. .................... 361/213

(Continued)

FOREIGN PATENT DOCUMENTS

JP   06-013333       1/1994
JP   06-013333 A     1/1994

(Continued)

OTHER PUBLICATIONS

E. P. Boonekamp et al., "The chemical oxidation of hydrogen-terminated silicon (111) surfaces in water studied in situ with Fourier transform infrared spectroscopy," J. Appl. Phys. 75:12, 1994, pp. 8121-8127.

(Continued)

*Primary Examiner* — Mamadou Diallo
*Assistant Examiner* — Joannie A Garcia
(74) *Attorney, Agent, or Firm* — Foley & Lardner LLP

(57) ABSTRACT

A cause of deteriorating the hydrogen termination on the surface of a wafer is found to be water adsorbed on the surface. By exposing the wafer to an inert gas atmosphere containing an $H_2$ gas so as to suppress the oxidation reaction due to the water, it is possible to improve the hydrogen termination on the wafer surface.

31 Claims, 8 Drawing Sheets

(56) References Cited

U.S. PATENT DOCUMENTS

| | | | |
|---|---|---|---|
| 5,754,166 A * | 5/1998 | Baba | 345/157 |
| 6,232,178 B1 * | 5/2001 | Yamamoto | 438/255 |
| 6,498,107 B1 * | 12/2002 | Fenner | 438/706 |
| 6,905,972 B2 | 6/2005 | Oda | |
| 7,103,990 B2 * | 9/2006 | Ohmi et al. | 34/325 |
| 2003/0045063 A1 | 3/2003 | Oda | |
| 2004/0007177 A1 * | 1/2004 | Ohmi et al. | 118/715 |
| 2005/0126030 A1 * | 6/2005 | Ohmi et al. | 34/58 |

FOREIGN PATENT DOCUMENTS

| | | |
|---|---|---|
| JP | 07-142438 A | 6/1995 |
| JP | 07-142438 A | 6/1995 |
| JP | 07-302775 | 11/1995 |
| JP | 2001-293443 A | 10/2001 |
| JP | 2003-077844 A | 3/2003 |
| JP | 2005-051141 A | 2/2005 |

OTHER PUBLICATIONS

Y. Nakagawa et al., "Measurement of Adsorbed Moisture Concentration on Solid Surface by Using Anhydrous Hydrogen Fluoride," Microcontamination Conference Proceedings, 1993, pp. 586-595.

Office Action for KR application No. 10-2008-7007942 issued Aug. 10, 2012 with partial English translation; 7 pages.

* cited by examiner

METHOD OF MANUFACTURING SEMICONDUCTOR DEVICE AND SEMICONDUCTOR MANUFACTURING APPARATUS

This application is the National Phase of PCT/JP2005/016805, filed Sep. 13, 2005, the disclosure of which is hereby incorporated by reference in its entirety.

TECHNICAL FIELD

This invention relates to a method for treatment of maintaining the hydrogen termination of the surface of a semiconductor, an apparatus for carrying out such maintaining treatment, and products such as a semiconductor device obtained by carrying out such maintaining treatment.

BACKGROUND ART

Manufacturing processes of a field-effect transistor constituting an integrated circuit formed in a semiconductor region will be described with reference to FIG. 1, using an LDD (Lightly Doped Drain)-structure n-type field-effect transistor as an example.

At first, element isolation is carried out, for example, by an STI (Shallow Trench Isolation) method, thereby forming an element region 102 on the surface of a p-type (100) plane silicon 101 serving as a semiconductor substrate (FIG. 1(a)).

Pre-oxidation cleaning such as RCA cleaning is applied to the element region 102 (FIG. 1(b)) to remove organic compounds, particles, and metal impurities and, thereafter, dilute hydrofluoric acid treatment and then rinsing with pure water are performed to hydrogen-terminate 103 the element region 102 (FIG. 1(c)). After drying the wafer (FIG. 1(d)), a gate insulating film ($SiO_2$) 104 is formed (FIG. 1(e)).

Then, boron is ion-implanted over the entire surface of the silicon 101 for controlling the threshold voltage (FIG. 1(f)).

Then, a polycrystalline silicon film is deposited over the entire surface of the silicon 101 and then patterned, thereby forming a gate electrode 105 of polycrystalline silicon on the gate insulating film 104 in the element region 102 (FIG. 1(g)).

Then, phosphorus is ion-implanted at a low concentration, thereby forming $n^-$ source and drain regions 106 that serve to relax high electric fields (FIG. 1(h)).

Then, a silicon oxide film ($SiO_2$) is deposited over the entire surface of the silicon 101 by a CVD method or the like so as to cover the gate electrode 105 and then anisotropic etching is performed, thereby forming a side-wall insulating film 107 on the side walls of the gate electrode 105 (FIG. 1(i)).

Thereafter, n-type impurities such as arsenic are ion-implanted at a high concentration, thereby forming $n^+$ source and drain regions 108 (FIG. 1(j)).

In Patent Document 1, the present inventors have previously pointed out that the hydrogen termination is deteriorated in a cleaning process, and proposed a technique for solving it.

In the case of the field-effect transistor forming method shown in FIG. 1, the process up to the formation of the gate insulating film 104 becomes discontinuous after the dilute hydrofluoric acid treatment to carry out the hydrogen termination 103. After drying the wafer, the wafer goes through stages of being placed in a carrier container, transferred to a gate oxidation apparatus, and subjected to the gate oxidation. In this case, after the drying up to the gate oxidation, the wafer is exposed to a CR (clean room) atmosphere. During this time, the terminated hydrogen 103 formed on the surface of the element region 102 is impaired with the lapse of time so that oxidation of the surface proceeds (FIG. 1(d)). A natural oxide film formed on the surface is nonuniformly formed over the element region 102 and, further, the density of the film itself is low, which thus becomes one cause for degrading the quality of the gate insulating film 104 formed thereafter.

The foregoing description is given using the n-type field-effect transistor as an example, but the same also applies to a semiconductor element such as a p-type field-effect transistor, a TFT, a CCD, or an IGBT.

In view of the problem described above, an attempt has been made to transfer a wafer in a vacuum or in an $N_2$ atmosphere from the drying process after the dilute hydrofluoric acid treatment to the gate oxidation. However, it is known that organic compounds adhere to the surface of the element region 102 in the vacuum transfer and, also in the transfer in the $N_2$ atmosphere, the hydrogen termination is impaired with an increase in exposure time and thus the growth of a natural oxide film cannot be completely suppressed.

On the other hand, Patent Document 1 only points out the deterioration of the hydrogen termination in the cleaning process, but does not disclose that the hydrogen termination is also deteriorated during the vacuum transfer.

Patent Document 1: Japanese Unexamined Patent Application Publication (JP-A) No. 2005-51141

DISCLOSURE OF THE INVENTION

Problem to be Solved by the Invention

This invention has been made under these circumstances and has an object to elucidate a cause of disappearance of the hydrogen termination during transfer of a wafer so as to provide a more efficient hydrogen termination maintaining method, and further has an object to provide a semiconductor device having an electrically reliable gate insulating film and its manufacturing method by maintaining the hydrogen termination to suppress the growth of a natural oxide film.

Means for Solving the Problem

This invention is characterized by maintaining the hydrogen termination by exposing the hydrogen-terminated surface to an inert gas containing hydrogen. FIG. 2 shows changing behavior of the hydrogen termination depending on the clean-room exposure time. Measurement was performed using an FTIR-ATR method. The state of change in absorption peak of silicon hydride was examined when the Si (100) plane was treated with FPM (solution in which 0.5% DHF and 0.5% $H_2O_2$ are added in pure water), then subjected to $N_2$ blow drying, and then exposed in a clean room. The exposure time was changed among 3 minutes, 2 hours, 4 hours, and 1 day. The silicon hydride peaks are distributed at 2060 to 2170 $cm^{-1}$ and the sharp peaks near 2110 $cm^{-1}$ are peaks caused by silicon dihydride. The peak intensities of the silicon hydride are lowered due to the exposure and the peaks completely disappear in the case of the 1-day exposure. Following the lowering of the silicon hydride peaks, other peaks appear near 2200 and 2250 $cm^{-1}$. These peaks are peaks that occur when oxygen is inserted into Si backbonds of Si—H bonds, and thus mean that Si—O—Si bonds are formed. This can be said to be one of initial reaction processes of oxidation.

In order to show the Si—H bond decreasing behavior more comprehensibly, the wave numbers were, in FIG. 3, divided into 2050 to 2170 $cm^{-1}$ as the Si—H system peaks and 2170 to 2300 $cm^{-1}$ as the hydride peaks in the form where oxygen is inserted into backbonds, and the respective relationships each between the integrated area and the clean-room exposure time were examined. The results are shown in FIG. 4.

As shown in FIG. 4(a), the silicon hydride peak area starts to decrease immediately after the start of the exposure and the peaks almost disappear after 6 hours. In contrast to this, as shown in FIG. 4(b), the area of the hydride peaks in the form where oxygen is inserted into backbonds starts to increase immediately after the exposure and reaches a maximum value after 4 hours so as to be saturated. From this data, it is seen that the hydrogen termination cannot be maintained by the clean-room exposure. Although this data was obtained for the Si (100) plane, it has been confirmed that there is the same tendency for the Si (110) or Si (111) plane.

In view of this, it is considered that the oxidation reaction on the surface may be prevented by exposure in an atmosphere with a very low oxygen partial pressure, for example, an inert gas atmosphere. The results of exposure in Ar and $N_2$ atmospheres are shown in FIG. 5. A sample was treated with FPM and, immediately after $N_2$ blow drying, it was placed in a metal container where Ar or $N_2$ was caused to flow at 1 slm, so as to be stored. The axis of ordinates represents the Si—H system silicon hydride peak area shown in FIG. 3. From FIG. 5, it is seen that although the hydrogen termination decreasing rate is slowed, the decrease cannot be completely suppressed.

The present inventors have studied a cause of generation of oxidizing species on the hydrogen-terminated surface. At first, it has been confirmed that the oxygen concentration in the Ar gas is at the several ppt level. Even if all the oxygen present in the Ar gas is adsorbed on the wafer surface, the number thereof is about $6 \times 10^{12}$ in the case of the exposure for 24 hours. Since the number of Si—H terminations on the Si surface is on the order of $10^{14}$, it is not possible to remove all the terminations by the oxidation reaction. Therefore, the cause of decreasing the hydrogen termination is not the oxygen contained in the Ar gas.

In view of this, it has been considered that oxygen for that cause is dissolved oxygen in water adsorbed on the surface. It is known that water molecules are adsorbed in as many as 100 molecular layers on the wafer surface after drying (Yoshinori Nakagawa et al., "Measurement of Adsorbed Moisture Concentration on Solid Surface by Using Anhydrous Hydrogen Fluoride, "Proceedings, Microcontamination 93, San Jose, pp. 586-595, September 1993). It is conjectured that, other than H ions and OH ions at ph=7, dissolved oxygen is also present in the water of 100 molecular layers. It is known that OH ions act as a catalyst in the oxidation reaction of Si—H in water (E. P. Boonekamp et al., JAP. 75, 8121 (1994)). Thus, it is conjectured that the decrease in Si—H termination and the oxidation reaction on the Si surface are caused due to the interaction between OH ions and dissolved oxygen.

Based on this conjecture, as measures to suppress the oxidation reaction on the surface, there are cited the following three, i.e. (1) reducing the amount of OH ions in water adsorbed on the surface, (2) reducing the amount of dissolved oxygen, and (3) reducing the oxidation-reduction potential so as to suppress the oxidation reaction. At this time, with respect to the above (1), it is currently difficult to change the pH of the adsorbed water. With respect to the above (2), it is expected that the dissolved oxygen is desorbed from the liquid phase into the gas phase by the storage in an inert gas atmosphere, but actually, as shown in FIG. 5, it is not possible to completely suppress the decrease in hydrogen termination. In view of this, in order to realize the above (3), a wafer was placed in an environment where hydrogen was added to an Ar atmosphere. It was conjectured that, in this state, the added hydrogen would be dissolved into adsorbed water and, further, dissolved oxygen contained in the adsorbed water would be desorbed into the atmosphere and then, at the time when the mole ratio between the dissolved oxygen and the dissolved hydrogen would be reversed, the oxidation-reduction potential would rapidly drop to suppress the oxidation reaction. The results are shown in FIG. 6. To explain the ratio of added $H_2$, the volume concentration of $H_2$ in a mixed gas of Ar and $H_2$ was adjusted to 3% and the flow rate of the mixed gas was set to 1 slm. The pressure was set to the atmospheric pressure. From FIG. 6, it is seen that no change is observed in the spectrum after exposure in the Ar+$H_2$ atmosphere (1 slm) for 6 hours as compared with the spectrum after exposure for 3 minutes. It was possible to confirm that the surface oxidation was suppressed by adding 3% hydrogen to an Ar gas.

To explain the reason for setting the volume concentration of $H_2$ in the mixed gas of Ar and $H_2$ to 3%, the explosion lower limit of hydrogen is 4% and thus it is not practical to set it to 4% or more because of danger at the time of mixing the air. It was judged that a maximum of 3% was practically adequate. A similar effect is obtained using an inert gas mixed with 20 ppm hydrogen. Further, it is also appropriate that the number of $H_2$ molecules is greater than that of $O_2$ molecules in an inert gas atmosphere. In this case, it becomes possible to lower the oxidation-reduction potential of water by dissolution of more $H_2$ molecules into the water.

About 5 ppm dissolved oxygen is contained in water adhering to the wafer surface and, when brought into contact with an inert gas containing 10 ppm hydrogen, the dissolved oxygen is desorbed into the inert gas and further the hydrogen in the inert gas is dissolved into the water. The mole ratio between the dissolved oxygen and the dissolved hydrogen is reversed in an instant to cause a reduction in oxidation-reduction potential. In this event, in order to increase the efficiency of substitution between the dissolved oxygen and the dissolved hydrogen, the mixed gas of the inert gas and hydrogen may be constantly caused to flow into a container at 10 sccm or more or the inert gas containing hydrogen may be introduced and sealed in a hermetic container.

Although it is also necessary to manage the concentration of oxygen mixed as impurities in the inert gas, $N_2$ or Ar used in a normal semiconductor grade is managed at an oxygen concentration of 10 ppm or less. With this impurity level, it is easy to reduce the oxidation-reduction potential by dissolution of hydrogen and thus the decrease in hydrogen termination can be efficiently prevented.

Effect of the Invention

According to the invention, by adding a hydrogen gas into an inert gas, it was possible to store a wafer without impairing the hydrogen termination formed after dilute hydrofluoric acid treatment. Introduction of this technique into a wafer carrier box of SMIF or the like is also easy. Further, the effect is also expected by introducing a mixed gas of an inert gas and a hydrogen gas into wafer transfer portions in a semiconductor manufacturing apparatus. Since a natural oxide film is not formed on the silicon surface, the reliability of a gate insulating film is also improved.

BEST MODE FOR CARRYING OUT THE INVENTION

Figure 1:
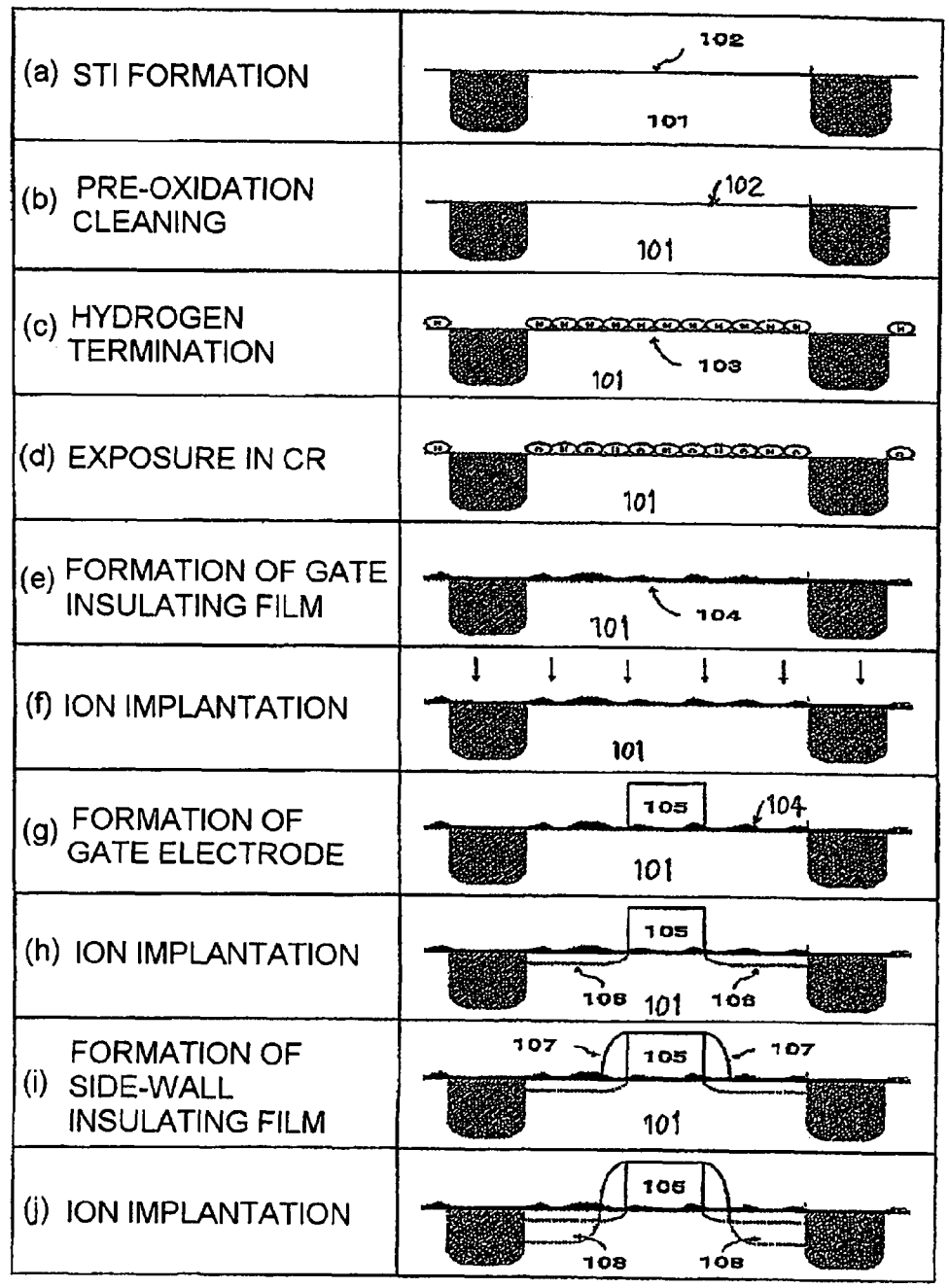
FIGS. 1(a) to 1(j) are schematic diagrams for explaining the manufacturing flow of a field-effect transistor according to a conventional technique.
Figure 2:
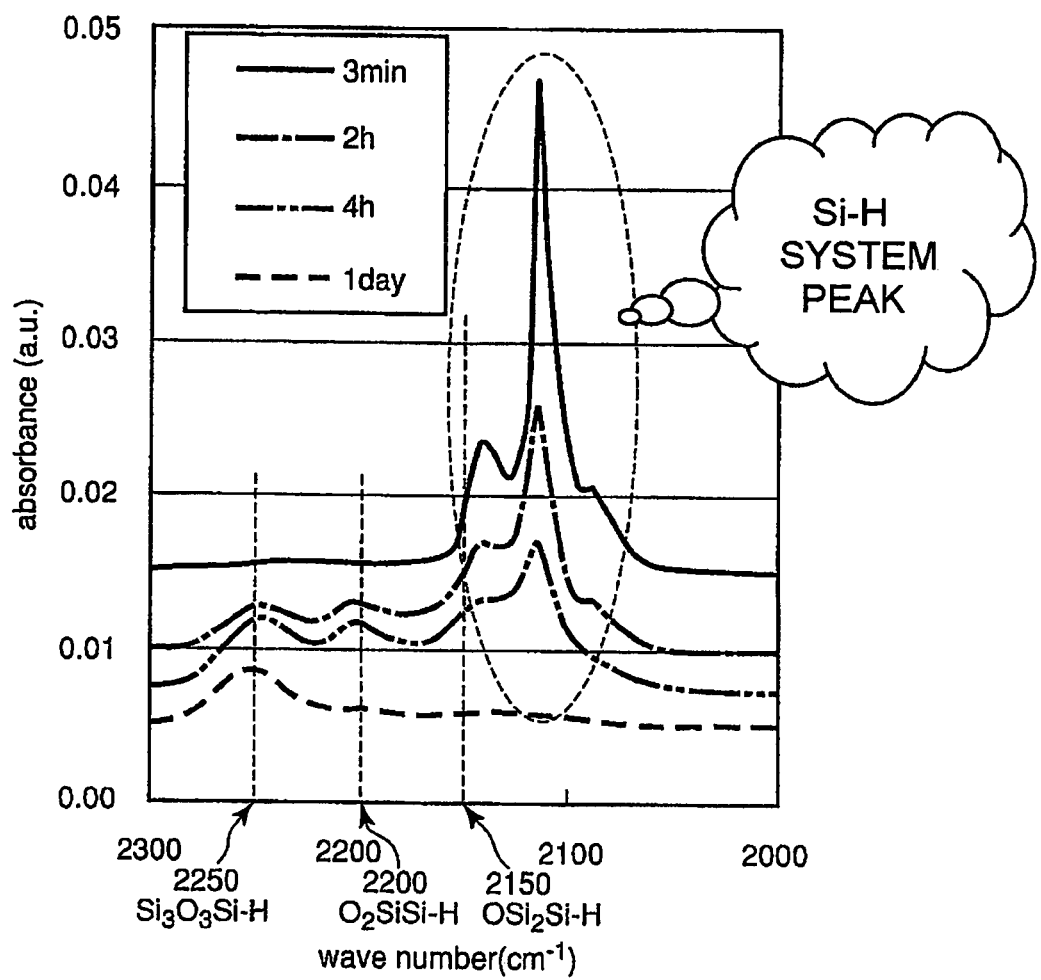
FIG. 2 is a graph for explaining the CR exposure time dependence of the hydrogen termination according to the FTIR-FTR measurement.
Figure 3:
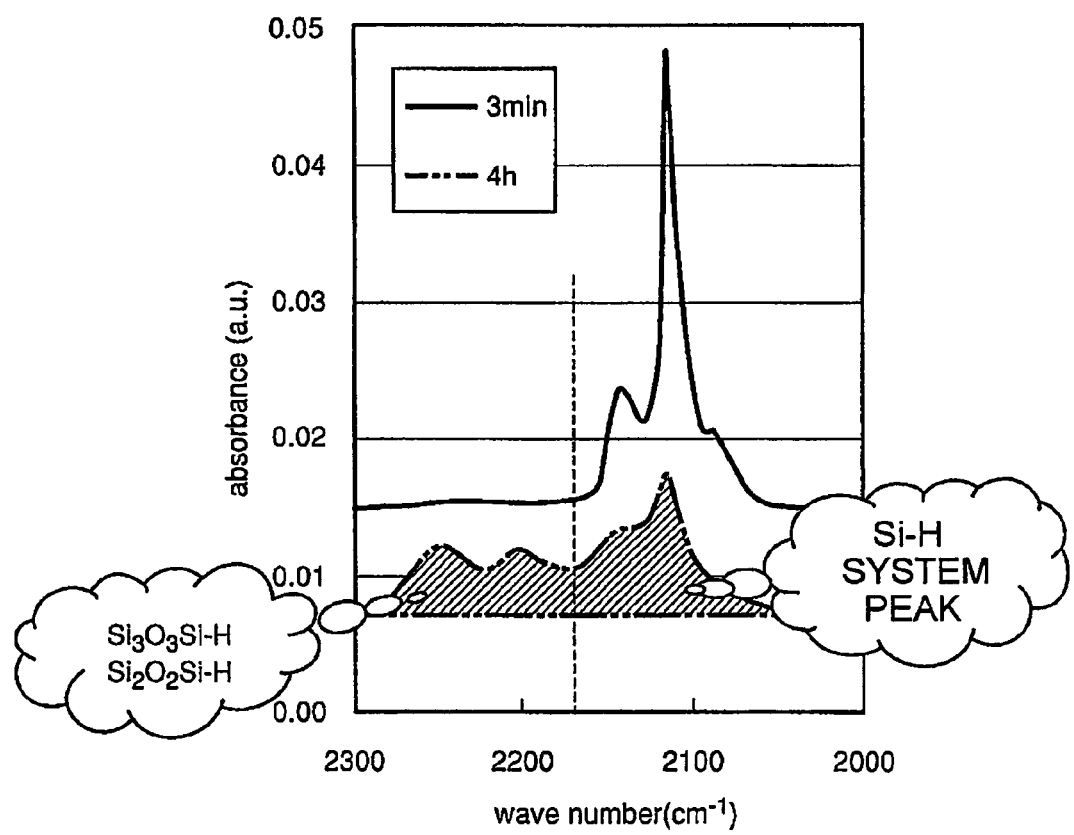
FIG. 3 is a graph for explaining the exposure time dependence of the silicon hydride peak and the hydride peak where oxygen is inserted into Si—Si backbonds.
Figure 4:
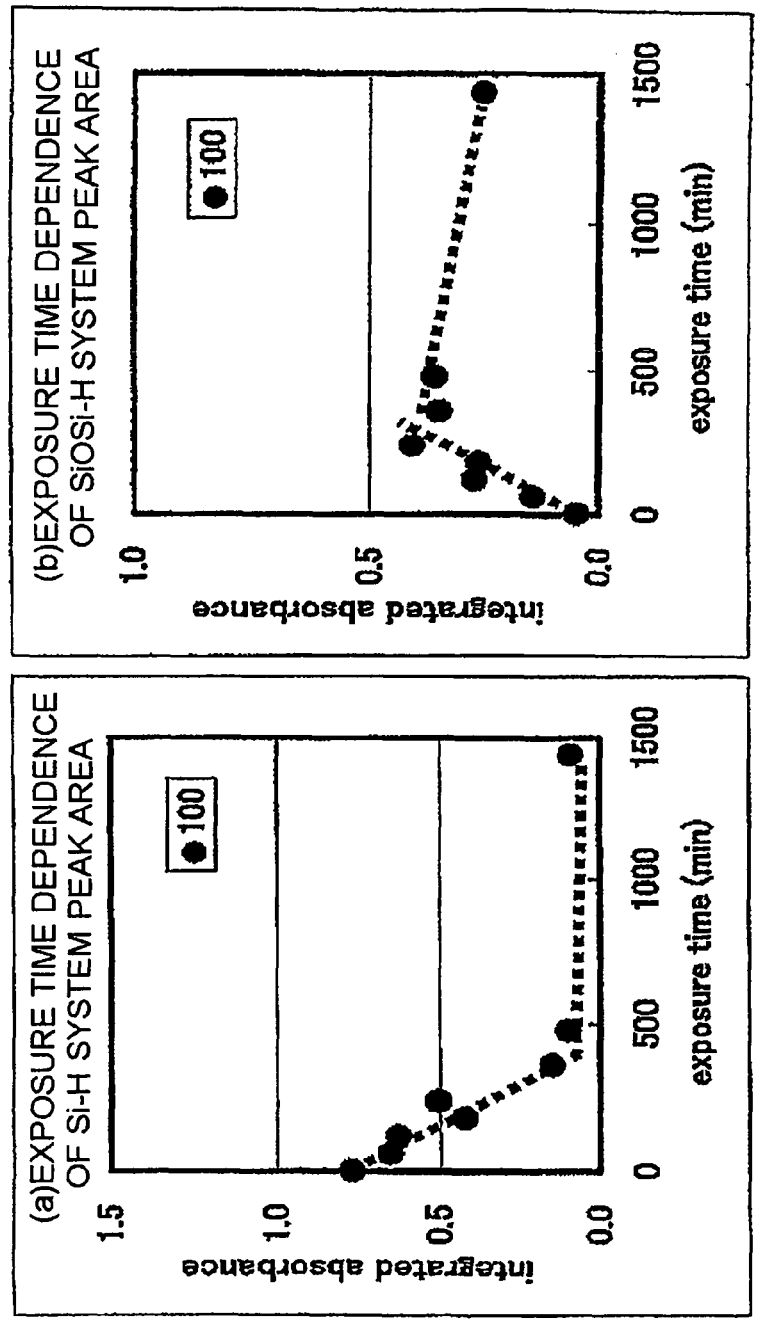
FIGS. 4(a) and 4(b) are graphs each showing the exposure time dependence of the peak area shown in FIGS. 2 and 3.
Figure 5:
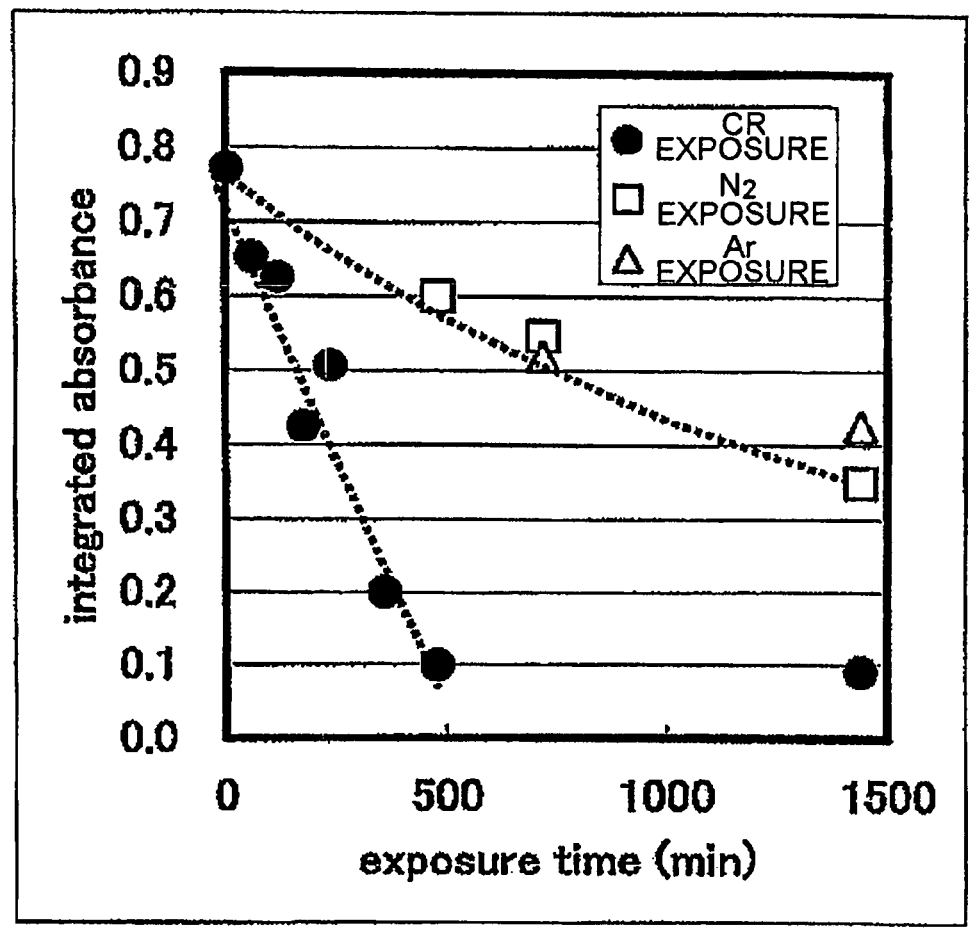
FIG. 5 is a graph showing changing behavior of the silicon hydride peak area of a sample placed in an $N_2$ or an Ar atmosphere.
Figure 6:
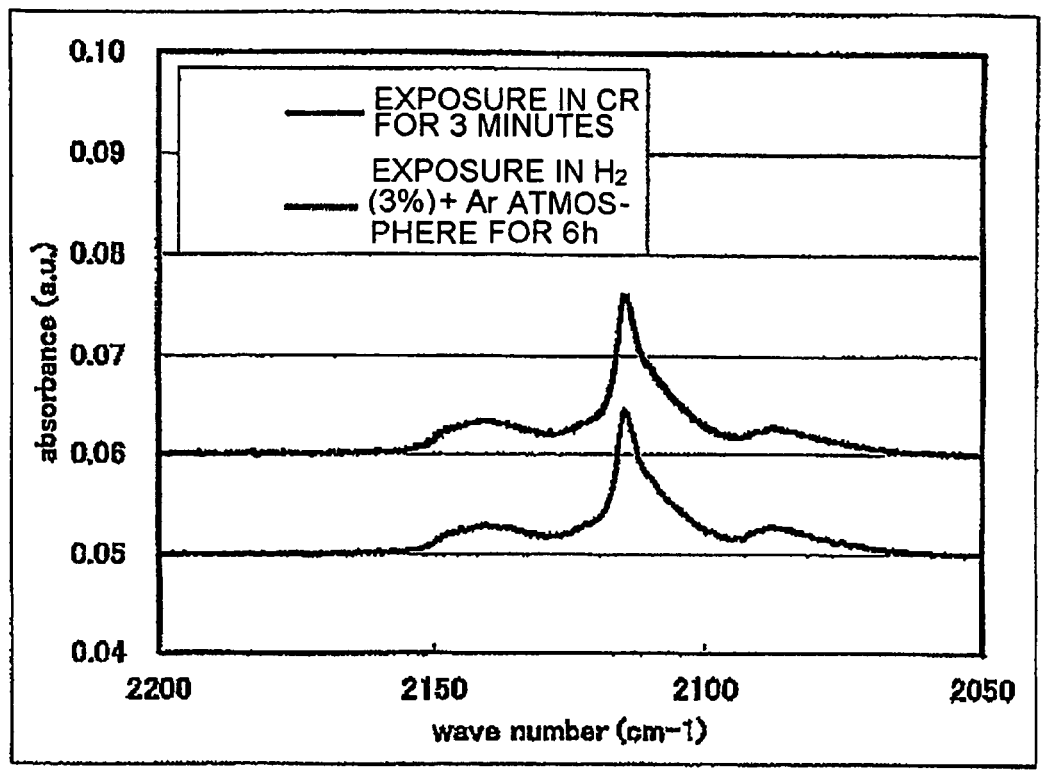
FIG. 6 is a graph for explaining the IR spectrum of a sample placed in an Ar atmosphere added with $H_2$, as compared with the IR spectrum of a sample placed in a CR.
Figure 7:
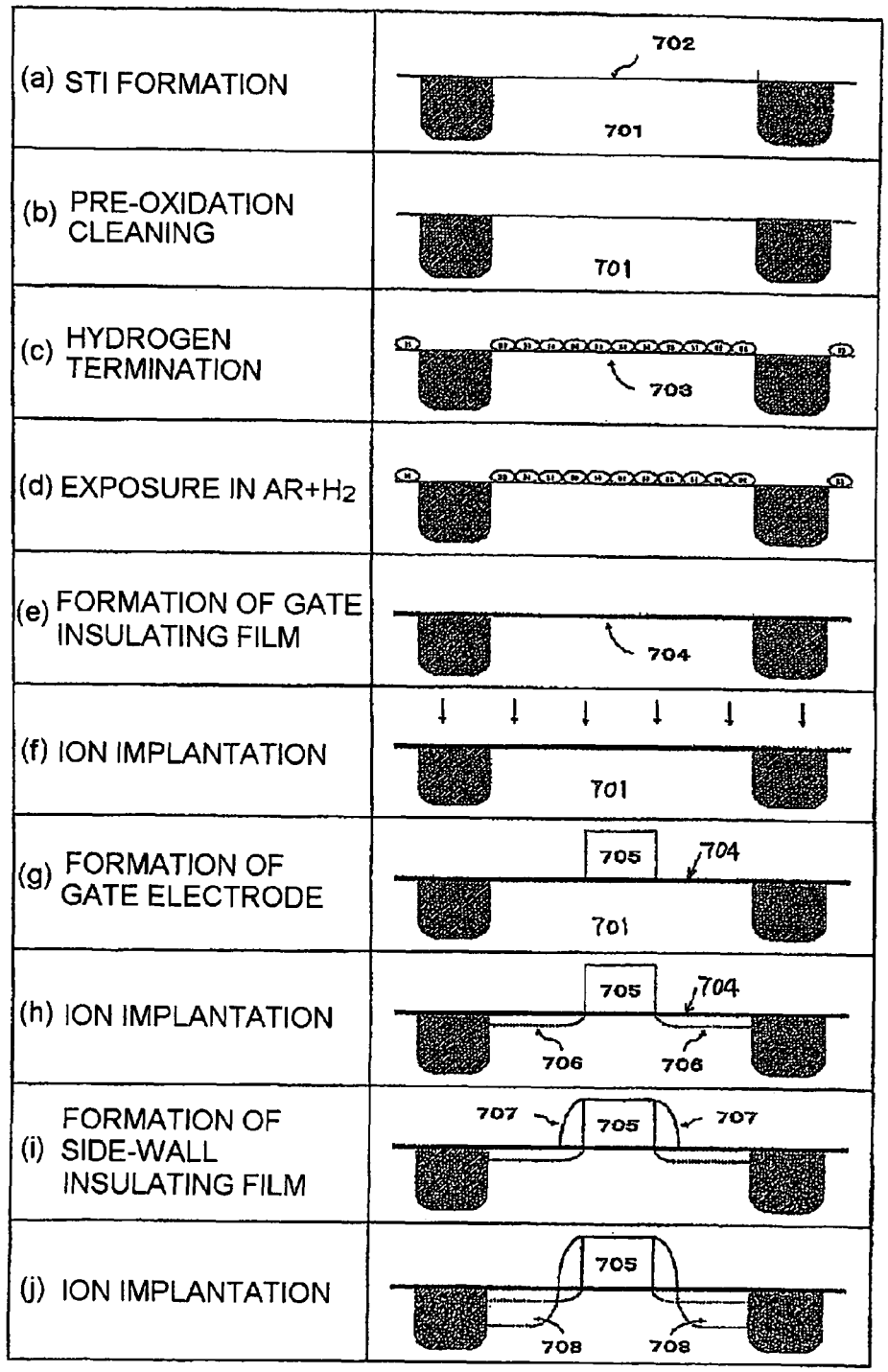
FIGS. 7(a) to 7(j) are schematic diagrams for explaining the manufacturing flow of a field-effect transistor according to this invention.

Manufacturing processes of a field-effect transistor constituting an integrated circuit formed in a semiconductor region will be described using an LDD (Lightly Doped Drain)-structure n-type field-effect transistor as an example. FIG. 7 shows the transistor flow and FIG. 8 is a diagram schematically showing part of a semiconductor manufacturing apparatus according to an embodiment of this invention for explaining a wafer handling method from hydrogen termination treatment to gate oxidation.

Element isolation is carried out, for example, by an STI (Shallow Trench Isolation) method, thereby forming an element region 702 including source, drain, and channel regions on the surface of a p-type (100) silicon wafer 701 (FIG. 7(a)).

Subsequently, the flow shifts to a first process that carries out the hydrogen termination.

Figure 8:
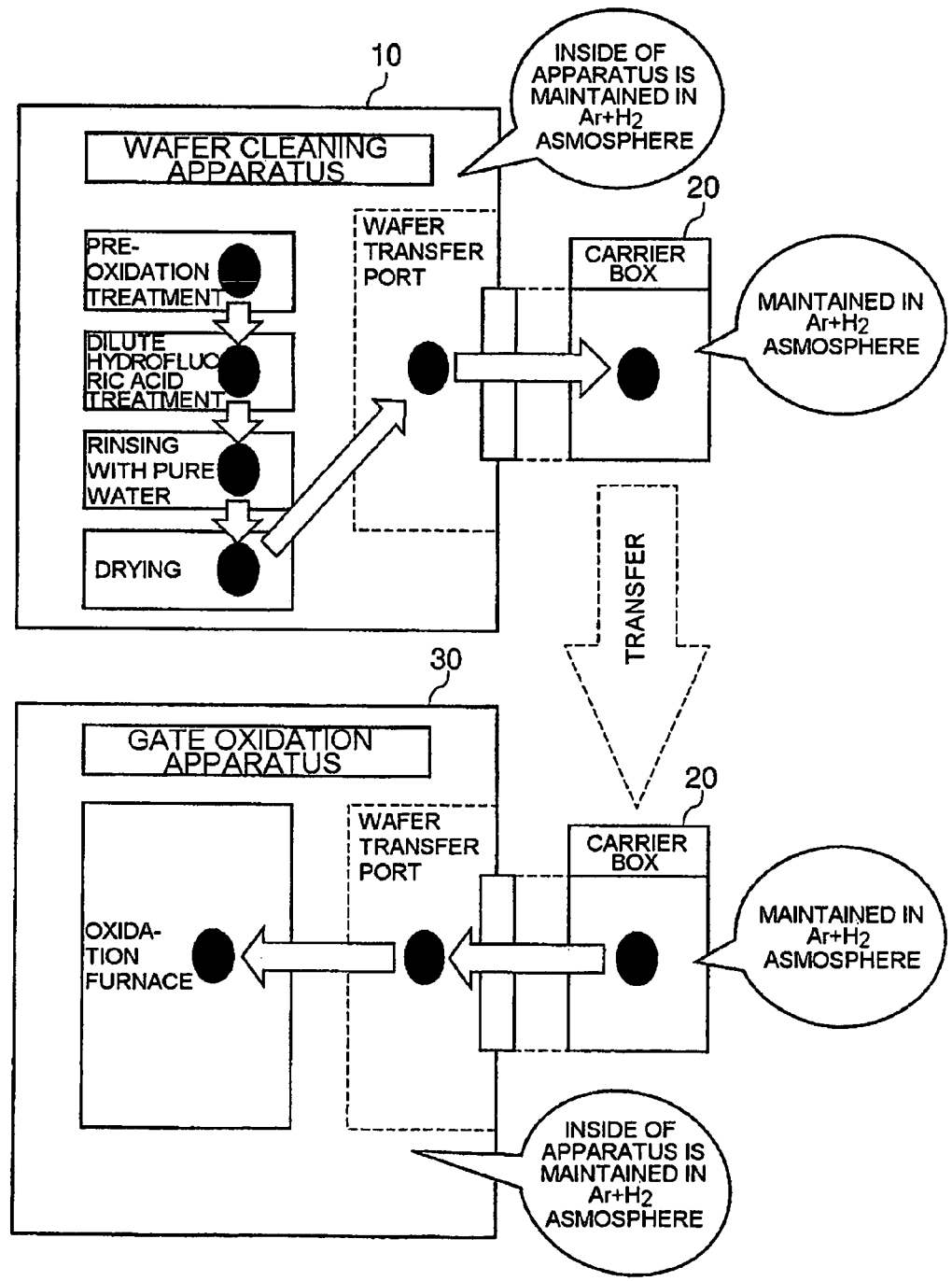
FIG. 8 is a diagram showing an example of wafer handling from the hydrogen termination to the formation of a gate insulating film according to this invention.

Using a chemical solution treatment apparatus (wafer cleaning apparatus 10), shown in FIG. 8, adapted to perform the hydrogen termination, pre-oxidation cleaning is applied to the element region 702 to remove organic compounds, particle, and metal contamination (FIG. 7(b)).

Thereafter, treatment with dilute hydrofluoric acid system, such as FPM treatment, and then rinsing with pure water and wafer drying are carried out to hydrogen-terminate 703 the element region 702 (FIG. 7(c)). The hydrogen termination treatment may be performed by, instead of the FPM treatment, DHF treatment, $NH_4F$ treatment, hot water treatment, pure water treatment, or the like. A hydrogen termination atmosphere may be an atmosphere of a mixed gas of Ar and $H_2$ (the volume ratio of hydrogen to the mixed gas is 3%). Further, the hydrogen termination treatment may be performed while carrying out vacuum ultraviolet irradiation or soft X-ray irradiation for removal of static electricity. The vacuum ultraviolet irradiation or the soft X-ray irradiation may be directly applied to the semiconductor or, instead of the direct irradiation, may be applied to a space where the semiconductor is present. Pure water added with hydrogen may be used in the pure-water rinsing. The water added with hydrogen is water whose oxidation-reduction potential is reduced in advance, and thus effectively suppresses the oxidation on the silicon surface. It may also be appropriate that the number of $H_2$ molecules is greater than that of oxygen molecules in pure water.

FIG. 8 shows an example where, after dilute hydrofluoric acid treatment, pure-water rinsing and wafer drying are performed in a mixed gas atmosphere of Ar and $H_2$.

Thereafter, the flow shifts to a second process. In FIG. 8, it is realized that the inside of a wafer carrier box 20 is maintained in an atmosphere of a mixed gas of Ar and $H_2$ (the volume ratio of hydrogen to the mixed gas is 3%) and the wafer is exposed therein (FIG. 7(d)).

The wafer is placed in the wafer carrier box 20 and transferred to a gate oxidation apparatus 30 (FIG. 8). The transfer may be carried out in the state where the mixed gas of Ar and $H_2$ is caused to flow at a flow rate of 10 sccm or more. On the other hand, if the wafer is left standing until gate oxidation, it may be stored in a container where a mixed gas atmosphere of Ar and $H_2$ is formed. During that time, the hydrogen termination is not impaired and the growth of a natural oxide film is not observed.

In the case of FIG. 8, in order to keep the state that prevents the growth of a natural oxide film until immediately before the gate oxidation, the inside of the gate oxidation apparatus 30 is also maintained in a mixed gas atmosphere of Ar and $H_2$. Using the gate oxidation apparatus 30, the silicon surface of the element region is oxidized to thereby form a 5 nm gate insulating film ($SiO_2$) 704 (FIG. 7(e)). It is sufficient that a silicon oxide film formed in this invention is present at least a portion being in contact with silicon and, therefore, use may be made of an insulating film formed, on the silicon oxide film, with one or more layers of different kinds of materials, such as an oxide, a nitride, an oxynitride, a silicate, and the like of an alkaline earth metal, a rare earth metal, and a transition metal. Instead of the silicon oxide film, use may be made of a single layer or a laminated structure of an oxide, a nitride, an oxynitride, a silicate, and the like of an alkaline earth metal, a rare earth metal, and a transition metal. Further, use may be made of a film including one or more of a silicon oxide film, a silicon nitride film, and a silicon oxynitride film.

Then, boron is ion-implanted over the entire surface of the silicon wafer 701 for controlling the threshold voltage (FIG. 7(f)).

Then, a polycrystalline silicon film is deposited over the entire surface of the silicon wafer 701 and then patterned, thereby forming a gate electrode 705 of polycrystalline silicon on the gate insulating film 704 in the element region 702 (FIG. 7(g)).

Then, phosphorus is ion-implanted at a low concentration, thereby forming $n^-$ source and drain regions 706 that serve to relax high electric fields (FIG. 7(h)).

Then, a silicon oxide film ($SiO_2$) is deposited over the entire surface of the silicon wafer 701 by a CVD method or the like so as to cover the gate electrode 705 and then anisotropic etching is performed, thereby forming a side-wall insulating film 707 on the side walls of the gate electrode 705 (FIG. 7(i)).

Thereafter, n-type impurities such as arsenic are ion-implanted at a high concentration, thereby forming $n^+$ source and drain regions 708 (FIG. 7(j)).

The technique of storing a wafer in an inert gas added with $H_2$ for preventing the decrease in hydrogen termination can obtain the same effect for silicon of any plane orientation and has the effect even for another semiconductor such as SiGe or Ge. Further, it can be used not only for the MOSFET of FIG. 7, but also, for example, for storage of a wafer after formation of contact holes and DHF treatment.

INDUSTRIAL APPLICABILITY

This invention is applicable not only to a semiconductor device having a gate insulating film of an MOS transistor and its manufacturing method, but also to a semiconductor device such as a TFT, a CCD, or an IGBT.

The invention claimed is:

1. A semiconductor device manufacturing method comprising:
maintaining hydrogen termination by, after completion of a first step of hydrogen-terminating a surface of a semiconductor, shifting to a second step of exposing said semiconductor to an atmosphere of an inert gas containing an $H_2$ gas, a volume concentration of the $H_2$ gas in a mixed gas of the inert gas and the $H_2$ gas being 20 ppm to 3%.

2. The semiconductor device manufacturing method according to claim 1, wherein said first step is performed in an atmosphere of an inert gas containing an $H_2$ gas.

3. The semiconductor device manufacturing method according to claim 1, wherein said inert gas is a gas containing at least one of $N_2$ and Ar.

4. The semiconductor device manufacturing method according to claim 1, wherein an oxygen concentration in said inert gas is 10 ppb or less.

5. The semiconductor device manufacturing method according to claim 1, wherein said inert gas containing said $H_2$ gas is caused to continuously flow at a flow rate of 10 sccm or more.

6. The semiconductor device manufacturing method according to claim 1, wherein said first step includes a semiconductor drying step.

7. The semiconductor device manufacturing method according to claim 1, wherein said first step and said second step are continuously performed.

8. The semiconductor device manufacturing method according to claim 1, wherein said semiconductor is silicon.

9. The semiconductor device manufacturing method, according to claim 1, wherein said second step is performed in a semiconductor carrier container.

10. The semiconductor device manufacturing method according to claim 1, wherein said second step is performed in a semiconductor storage container.

11. The semiconductor device manufacturing method according to claim 1, wherein said second step is performed in a semiconductor manufacturing apparatus that performs said first step.

12. The semiconductor device manufacturing method according to claim 1, wherein vacuum ultraviolet irradiation or soft X-ray irradiation is applied to a space where said semiconductor is present, for removal of electricity of said semiconductor in at least one of said first and second steps or between said first and second steps.

13. The semiconductor device manufacturing method according to claim 1, wherein said, first step performs the hydrogen termination using an HF-based chemical solution.

14. The semiconductor device manufacturing method according to claim 1, wherein said first step performs rinsing with $H_2O$ added with $H_2$ after the hydrogen termination.

15. The semiconductor device manufacturing method according to claim 14, wherein the number of molecules of the added $H_2$ in the $H_2O$ added with the $H_2$ is greater than that of molecules of dissolved oxygen in the $H_2O$.

16. A semiconductor device manufacturing method, comprising:
maintaining hydrogen termination by, after completion of a first step of hydrogen-terminating a surface of a semiconductor, shifting to a second step of exposing said semiconductor to an atmosphere of an inert gas containing an $H_2$ gas, the number of $H_2$ molecules being greater than that of $O_2$ molecules in the atmosphere of the inert gas containing the $H_2$ gas.

17. A semiconductor manufacturing apparatus wherein hydrogen termination is maintained by, after completion of a first step of hydrogen-terminating a surface of a semiconductor, shifting to a second step of exposing said semiconductor to an inert gas atmosphere containing an $H_2$ gas, a volume concentration of the $H_2$ gas in a mixed gas of the inert gas and the $H_2$ gas being 20 ppm to 3%.

18. The semiconductor manufacturing apparatus according to claim 17, wherein said first step is performed in an atmosphere of an inert gas containing an $H_2$ gas.

19. The semiconductor manufacturing apparatus according to claim 17, wherein said inert gas is a gas containing at least one of $N_2$ and Ar.

20. The semiconductor manufacturing apparatus according to claim 17, wherein an oxygen concentration in said inert gas is 10 ppb or less.

21. The semiconductor manufacturing apparatus according to claim 17, wherein said inert gas containing the H2 gas is caused to continuously flow at a flow rate of 10 sccm or more.

22. The semiconductor manufacturing apparatus according to claim 17, wherein said first step includes a semiconductor drying step.

23. The semiconductor manufacturing apparatus according to claim 17, wherein said first step and said second step are performed continuously.

24. The semiconductor manufacturing apparatus according to claim 17, wherein said second step is performed in a semiconductor carrier container.

25. The semiconductor manufacturing apparatus according to claim 17, wherein said second step is performed in a semiconductor storage container.

26. The semiconductor manufacturing apparatus according to claim 17, wherein said second step is performed in a semiconductor manufacturing apparatus that performs said first step.

27. The semiconductor manufacturing apparatus according to claim 17, wherein vacuum ultraviolet irradiation or soft X-ray irradiation is applied to a space where said semiconductor is present, for removal of electricity of said semiconductor in at least one of said first and second steps or between said first and second steps.

28. The semiconductor manufacturing apparatus according to claim 17, wherein said first step performs the hydrogen termination using an HF-based chemical solution.

29. The semiconductor manufacturing apparatus according to claim 17, wherein said first step performs rinsing with $H_2O$ added with $H_2$ after the hydrogen termination.

30. The semiconductor manufacturing apparatus according to claim 29, wherein the number of molecules of the added $H_2$ in the $H_2O$ added with the $H_2$ is greater than that of molecules of dissolved oxygen in the $H_2O$.

31. A semiconductor manufacturing apparatus comprising:
maintaining hydrogen termination by, after completion of a first step of hydrogen-terminating a surface of a semiconductor, shifting to a second step of exposing said semiconductor to an inert gas atmosphere containing an $H_2$ gas, the number of $H_2$ molecules being greater than that of $O_2$ molecules in the atmosphere of the inert gas containing the $H_2$ gas.

* * * * *